(12) United States Patent
Sinha

(10) Patent No.: US 8,148,263 B2
(45) Date of Patent: Apr. 3, 2012

(54) METHODS FOR FORMING CONDUCTIVE VIAS IN SEMICONDUCTOR DEVICE COMPONENTS

(75) Inventor: Nishant Sinha, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/648,864

(22) Filed: Dec. 29, 2009

(65) Prior Publication Data

US 2010/0133661 A1 Jun. 3, 2010

Related U.S. Application Data

(60) Continuation of application No. 11/717,437, filed on Mar. 12, 2007, now Pat. No. 7,666,788, which is a division of application No. 10/668,914, filed on Sep. 23, 2003, now Pat. No. 7,345,350.

(51) Int. Cl.
*H01L 21/302* (2006.01)
*H01L 21/461* (2006.01)

(52) U.S. Cl. ............ 438/667; 438/672; 257/E21.597

(58) Field of Classification Search ............ 438/667, 438/666, 597, 672; 257/E21.597, E21.511, 257/E23.011, E23.114, E23.004, E23.067, 257/E23.178
See application file for complete search history.

(56) References Cited

U.S. PATENT DOCUMENTS

| | | |
|---|---|---|
| 2,820,752 A | 1/1958 | Heller |
| 3,577,324 A | 5/1971 | Patterson |
| 4,179,800 A | 12/1979 | Takaba et al. |
| 4,211,603 A | 7/1980 | Reed |
| 4,312,897 A | 1/1982 | Reimann |
| 4,325,780 A | 4/1982 | Schulz, Sr. |
| 4,487,654 A | 12/1984 | Coppin |
| 4,525,246 A | 6/1985 | Needham |
| 4,605,471 A | 8/1986 | Mitchell |
| 4,692,349 A | 9/1987 | Georgiou et al. |
| 4,720,324 A | 1/1988 | Hayward |
| 4,808,273 A | 2/1989 | Hua et al. |
| 4,830,264 A | 5/1989 | Bitaillou et al. |
| 4,954,313 A | 9/1990 | Lynch |
| 4,978,639 A | 12/1990 | Hua et al. |
| 5,160,579 A | 11/1992 | Larson |

(Continued)

FOREIGN PATENT DOCUMENTS

EP 0907206 4/1999

(Continued)

OTHER PUBLICATIONS

International Search Report for International Application No. PCT/US2004/030946, dated Apr. 12, 2005, 7 pages.

(Continued)

*Primary Examiner* — Walter L Lindsay, Jr.
(74) *Attorney, Agent, or Firm* — TraskBritt

(57) ABSTRACT

A method for forming conductive vias in a substrate of a semiconductor device component includes forming one or more holes, or apertures or cavities, in the substrate so as to extend only partially through the substrate. A barrier layer, such as an insulative layer, may be formed on surfaces of each hole. Surfaces within each hole may be coated with a seed layer, which facilitates adhesion of conductive material within each hole. Conductive material is introduced into each hole. Introduction of the conductive material may be effected by deposition or plating. Alternatively, conductive material in the form of solder may be introduced into each hole.

25 Claims, 12 Drawing Sheets

U.S. PATENT DOCUMENTS

| | | | |
|---|---|---|---|
| 5,168,624 | A | 12/1992 | Shirai |
| 5,218,761 | A | 6/1993 | Maniwa et al. |
| 5,224,265 | A | 7/1993 | Dux et al. |
| 5,228,966 | A | 7/1993 | Murata |
| 5,245,751 | A | 9/1993 | Locke et al. |
| 5,262,718 | A | 11/1993 | Svendsen et al. |
| 5,285,352 | A | 2/1994 | Pastore et al. |
| 5,309,632 | A | 5/1994 | Takahashi et al. |
| 5,374,788 | A | 12/1994 | Endoh |
| 5,421,083 | A | 6/1995 | Suppelsa et al. |
| 5,424,245 | A | 6/1995 | Gurtler et al. |
| 5,424,966 | A | 6/1995 | Hirayama |
| 5,536,908 | A | 7/1996 | Etchells et al. |
| 5,674,787 | A | 10/1997 | Zhao et al. |
| 5,682,062 | A | 10/1997 | Gaul |
| 5,689,091 | A | 11/1997 | Hamzehdoost et al. |
| 5,853,559 | A | 12/1998 | Tamaki et al. |
| 5,859,407 | A | 1/1999 | Saiki et al. |
| 5,876,580 | A | 3/1999 | Lykins, II |
| 5,897,368 | A | 4/1999 | Cole, Jr. et al. |
| 6,027,995 | A | 2/2000 | Chiang et al. |
| 6,032,527 | A | 3/2000 | Genova et al. |
| 6,066,892 | A * | 5/2000 | Ding et al. .................... 257/751 |
| 6,072,236 | A | 6/2000 | Akram et al. |
| 6,114,768 | A | 9/2000 | Gaul et al. |
| 6,169,024 | B1 | 1/2001 | Hussein |
| 6,197,664 | B1 | 3/2001 | Lee et al. |
| 6,228,684 | B1 | 5/2001 | Maruyama |
| 6,228,687 | B1 | 5/2001 | Akram et al. |
| 6,228,754 | B1 | 5/2001 | Iacoponi et al. |
| 6,230,400 | B1 | 5/2001 | Tzanavaras et al. |
| 6,235,624 | B1 | 5/2001 | Sasaki et al. |
| 6,242,935 | B1 | 6/2001 | Akram |
| 6,252,300 | B1 | 6/2001 | Hsuan et al. |
| 6,255,126 | B1 | 7/2001 | Mathieu et al. |
| 6,277,412 | B1 | 8/2001 | Otterbeck |
| 6,277,669 | B1 | 8/2001 | Kung et al. |
| 6,291,332 | B1 | 9/2001 | Yu et al. |
| 6,384,481 | B1 | 5/2002 | Hussein et al. |
| 6,406,939 | B1 | 6/2002 | Lin |
| 6,418,616 | B2 | 7/2002 | Bhatt et al. |
| 6,444,576 | B1 | 9/2002 | Kong |
| 6,448,644 | B1 | 9/2002 | Lin |
| 6,468,889 | B1 | 10/2002 | Iacoponi et al. |
| 6,479,382 | B1 | 11/2002 | Naem |
| 6,497,800 | B1 | 12/2002 | Talieh et al. |
| 6,498,381 | B2 | 12/2002 | Halahan et al. |
| 6,529,022 | B2 | 3/2003 | Pierce |
| 6,562,709 | B1 | 5/2003 | Lin |
| 6,565,729 | B2 | 5/2003 | Chen et al. |
| 6,565,730 | B2 | 5/2003 | Chakravorty et al. |
| 6,607,938 | B2 | 8/2003 | Kwon et al. |
| 6,610,596 | B1 | 8/2003 | Lee et al. |
| 6,620,731 | B1 | 9/2003 | Farnworth et al. |
| 6,634,100 | B2 | 10/2003 | Akram et al. |
| 6,670,269 | B2 | 12/2003 | Mashino |
| 6,711,812 | B1 | 3/2004 | Lu et al. |
| 6,743,499 | B2 | 6/2004 | Suemasu et al. |
| 6,768,205 | B2 | 7/2004 | Taniguchi et al. |
| 6,852,627 | B2 | 2/2005 | Sinha |
| 6,863,794 | B2 | 3/2005 | Tsai et al. |
| 6,908,845 | B2 | 6/2005 | Swan et al. |
| 6,963,483 | B2 | 11/2005 | Chakravorty et al. |
| 7,007,378 | B2 | 3/2006 | Gaudiello et al. |
| 7,101,792 | B2 | 9/2006 | Kirby et al. |
| 7,108,776 | B2 | 9/2006 | Sakaki |
| 7,316,063 | B2 | 1/2008 | Farnworth et al. |
| 7,345,350 | B2 | 3/2008 | Sinha |
| 7,594,322 | B2 | 9/2009 | Farnworth et al. |
| 7,603,772 | B2 | 10/2009 | Farnworth et al. |
| 7,608,904 | B2 | 10/2009 | Sinha |
| 7,666,788 | B2 | 2/2010 | Sinha |
| 2002/0019069 | A1 | 2/2002 | Wada |
| 2002/0030245 | A1 | 3/2002 | Hanaoka et al. |
| 2003/0151144 | A1 | 8/2003 | Muta et al. |
| 2004/0173454 | A1 | 9/2004 | Olgado et al. |
| 2004/0178495 | A1 | 9/2004 | Yean et al. |
| 2005/0014311 | A1 | 1/2005 | Hayasaka et al. |
| 2005/0178657 | A1 | 8/2005 | Kirby et al. |
| 2006/0180940 | A1 | 8/2006 | Kirby et al. |
| 2006/0254808 | A1 | 11/2006 | Farnworth et al. |
| 2007/0166991 | A1 | 7/2007 | Sinha |

FOREIGN PATENT DOCUMENTS

| | | |
|---|---|---|
| JP | 62-43008 | 2/1987 |
| JP | 04-356956 | 12/1992 |
| JP | 11251316 | 9/1999 |
| JP | 2000-195861 | 7/2000 |
| JP | 2000-260934 | 9/2000 |
| JP | 2001-144181 A | 5/2001 |
| JP | 2003-203914 A | 7/2003 |
| JP | 2003-218061 | 7/2003 |

OTHER PUBLICATIONS

Written Opinion of the International Searching Authority for International Application No. PCT/US2004/030946, dated Apr. 12, 2005, 9 pages.

* cited by examiner

METHODS FOR FORMING CONDUCTIVE VIAS IN SEMICONDUCTOR DEVICE COMPONENTS

CROSS-REFERENCE TO RELATED APPLICATION

This application is a continuation of U.S. patent application Ser. No. 11/717,437, filed Mar. 12, 2007, now U.S. Pat. No. 7,666,788, issued Feb. 23, 2010, which application is a divisional of U.S. patent application Ser. No. 10/668,914, filed Sep. 23, 2003, now U.S. Pat. No. 7,345,350, issued Mar. 18, 2008, the entire disclosures of each of which are hereby incorporated herein by this reference. This application is also related to U.S. patent application Ser. No. 11/717,294, filed Mar. 12, 2007, now U.S. Pat. No. 7,608,904, issued Oct. 27, 2009.

BACKGROUND OF THE INVENTION

1. Field of the Invention

The present invention relates generally to semiconductor fabrication. More particularly, the present invention relates to methods for making electrical interconnects from one surface of a substrate of a semiconductor component to the opposite surface of the substrate of the semiconductor component and, more particularly, to methods for fabricating a through-via in a wafer, interposer, or other substrate.

2. State of the Art

Semiconductor chips may be produced with integrated circuits on both sides of the chip or may be designed to connect to or interact with other electronic components or other semiconductor chips. Interposers may be utilized for interfacing two electrical components, such as a semiconductor device and a printed circuit board, and contactor boards may be used to interface a semiconductor wafer and a probe card for testing the dice on the semiconductor wafer. Semiconductor chips may be formed of semiconductor wafer or other bulk substrate material, while interposers and contactor boards may be formed of silicon, ceramic or polymeric substrates.

Conductively lined or filled holes (hereinafter "vias") are used for connecting an integrated circuit on one side of a chip to: an integrated circuit on the other side of the chip, a ground or other bias voltage, another electronic component or an integrated circuit on another chip. Vias are also used for providing electrical communication between structures disposed on opposing sides of an interposer or contactor board, wherein the structures may align with contact pads or other structures of electrical components and establish electrical connection between the various components.

The continued miniaturization of integrated circuits results in vias having increasingly higher aspect ratios, which term refers to the ratio of height or length to width or diameter of the via. One factor contributing to the increasingly higher aspect ratios is that the width of vias is continually getting smaller. Known processes used for filling the high-aspect-ratio vias in stacked chips, interposers and contactor boards, which are typically about fifty microns wide, have difficulty filling these vias without forming voids or keyholes in the via. Conventionally, the vias may be lined with a seed layer of a metal, such as copper, using chemical vapor deposition (CVD) or physical vapor deposition (PVD), whereafter the seed layer is coated by electroplating. As the aspect ratios of the vias get higher, it becomes more difficult to cause the plating material to line or fill the vias without vugs, voids, or keyholes therein, which adversely affect the conductivity of the via.

Referring to FIG. 1, there is shown a cross-section of a substrate generally at 10. The substrate 10 includes a via 12 that is filled using an electroplating process known in the art. The interior of the via 12 is coated with a metal layer 14, which has been deposited using the electroplating process. Electroplating is an electrochemical process by which metal, in ionic form in solution, is deposited on a substrate immersed in a bath containing the ionic form of the metal. A current is passed from an anode through the electroplating solution such that the metal ions are deposited on the cathode provided by a seed layer of metal of the substrate. As illustrated, a surface of the metal layer 14 is uneven and when the via 12 is filled to completion, the uneven surface may result in the formation of one or more voids in the contact mass filling the via. In other known processes, the via may be filled by an electroless plating process. In electroless plating, a seed layer may be formed by, for example, using plasma-enhanced chemical vapor deposition (PECVD). The seed layer is coated by a metal layer by placing the substrate in a bath that contains metal ions in aqueous solution and a chemical reducing agent such that the metal ions are deposited on the seed layer by a chemical reduction process.

FIG. 2 illustrates a cross-section of another substrate generally at 20. The substrate 20 includes a via 22 filled with a metal layer 24 using electroplating as known in the art. The metal layer 24 was deposited more efficiently near the upper and lower surfaces of the substrate 20 and resulted in the via 22 being substantially closed near the upper and lower surfaces of the substrate 20 while a middle portion of the via 22 was left unfilled. The unfilled portion 26 of the via 22 is referred to as a keyhole and the presence of the keyhole detracts from the electrical conductivity of the via 22.

In an attempt to avoid the formation of voids and keyholes in the via, other methods have been developed to fill the vias. FIG. 3 is a cross-section of a substrate generally at 30. The substrate 30 includes a via 32, being filled using electroless plating as known in the art. The substrate 30 is placed in a bath for an electroless plating process, also referred to as immersion plating. As illustrated, a metal layer 34 is formed over a seed layer (not shown) on the sidewall of the via 32 by the continuous deposition of metal until the via 32 is substantially filled with the metal. However, the electroless deposition process of FIG. 3 may result in voids or depressions being present in the via 32. Further, since electroless plating is relatively slow, i.e., the metal, such as nickel, is deposited at a maximum rate of approximately 20 microns per hour, the extended time to complete the deposition process may be undesirable. For instance, if the via is 70 μm wide, the deposition process would take about one and three-quarter hours to deposit about 35 μm of metal on the interior of the via 32 (70 μm/2) as the metal layer 34 grows inwardly toward the center of the via to completely fill the via 32.

In another attempt to avoid the formation of voids and keyholes in a via, an electroless bottom fill process as known in the art may be used. FIG. 4 illustrates a cross-section of a substrate generally at 40. The substrate 40 includes a via 42 and a layer of a metal 44 deposited on a bottom 46 of the via 42 and growing towards a top 48 of the via 42. The bottom 46 of the via 42 may comprise a suitable metal such as copper (Cu), nickel (Ni) or tungsten (W). The approach of the bottom fill process is that by depositing the layer of metal 44 in one direction, upward, and not from the sides of the via 42 (as shown in FIG. 3), voids and keyholes are not formed between layers of metal growing towards each other. The bottom fill process may be performed with copper in an attempt to avoid keyhole formation in the via due to migration of the copper. However, since the vias may be as deep as, e.g., 700 microns, and electroless plating deposits metal at the aforementioned relatively slow rate, the process to completely fill the via is unacceptably time consuming. Electroplating from the bottom of a via is also known, wherein a conductor serving as a cathode is placed over the bottom of a substrate, covering the bottoms of the vias. However, such an approach severely limits the stage of wafer processing at which the via may be filled and may impose design limitations on other structures formed or to be formed on the substrate.

Accordingly, a need exists for an improved method for filling vias that is faster than known processes, does not leave voids, depressions, or keyholes in the filled via and is cost effective to manufacture.

BRIEF SUMMARY OF THE INVENTION

The present invention, in a number of embodiments, overcomes the above difficulties by providing a method for forming a conductive via in a semiconductor component and semiconductor components resulting therefrom. The methods of forming conductive vias of the present invention are faster than known processes since the conductive via is not completely filled with an electroplated or electroless plated metal. Further, the conductive vias of the present invention include an annular layer of conductive material that is substantially free of vugs, voids, and keyholes such that the conductivity of the via is not compromised.

One exemplary embodiment of a method for forming a conductive via in a semiconductor component includes providing a substrate having a first surface and an opposing second surface. At least one hole extending from the first surface to the second surface of the substrate is formed through the substrate. A seed layer is applied to the first surface, the second surface and a sidewall defining the at least one hole formed in the substrate. The seed layer overlying the first surface and the opposing second surface of the substrate is removed, leaving the seed layer on the sidewall of the at least one hole. The seed layer on the sidewall is coated with a conductive layer and a conductive or nonconductive filler material is introduced into a remaining space in the at least one hole.

In another exemplary embodiment, a second method for fabricating a conductive via through a substrate is also disclosed. The method comprises providing a substrate having a first surface and an opposing second surface. At least one cavity is formed in the first surface of the substrate. A conductive layer is applied over the first surface of the substrate and an exposed area of the substrate that defines the at least one cavity. A filler material is introduced into a remaining space of the at least one cavity. The conductive layer and the filler material introduced into the at least one cavity are exposed on the opposing second surface of the substrate.

Yet another exemplary embodiment comprises an intermediate semiconductor component including at least one conductive via precursor structure. The intermediate semiconductor component includes a substrate having a first surface and an opposing second surface. The at least one conductive via precursor structure extends into the first surface of the substrate and terminates in the substrate before reaching the opposing second surface. The at least one via precursor structure includes an annular conductive layer that extends from the first surface and circumscribes a conductive or nonconductive filler material.

A further exemplary embodiment of the present invention comprises a semiconductor component including a substrate having a first surface and an opposing second surface and at least one conductive via extending therebetween. The at least one conductive via includes an annular conductive layer that extends from the first surface of the substrate to the second surface of the substrate. A conductive or nonconductive filler material is circumscribed by the annular conductive layer and extends from the first surface of the substrate to the opposing, second surface of the substrate.

The present invention also encompasses, in yet another embodiment, a system including a microprocessor and at least one memory device in communication with the microprocessor. The at least one memory device comprises a substrate having a first surface and an opposing, second surface and at least one conductive via extending therebetween. The at least one conductive via includes an annular layer of conductive material extending from the first surface of the substrate to the opposing, second surface of the substrate. A conductive or nonconductive filler material is circumscribed by the annular layer of the conductive material and extends from the first surface of the substrate to the opposing, second surface of the substrate. The memory device also includes at least one bond pad overlying the at least one conductive via.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 2:
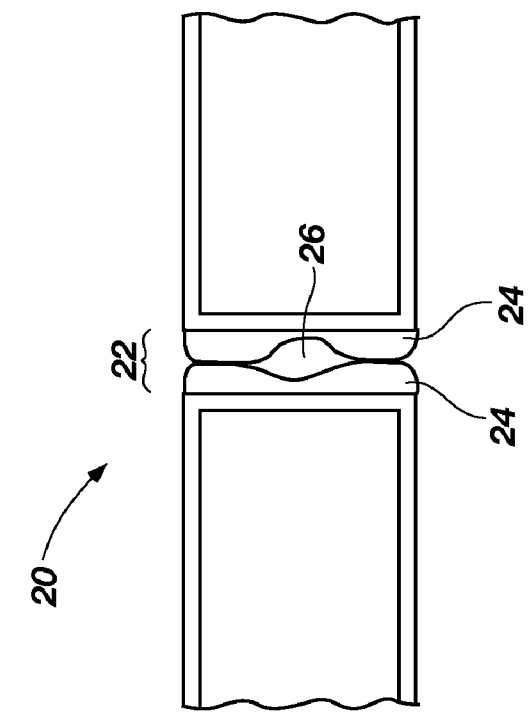
FIG. 2 illustrates a cross-section of a substrate having a via substantially filled using an electroplating process as known in the art.
Figure 1:
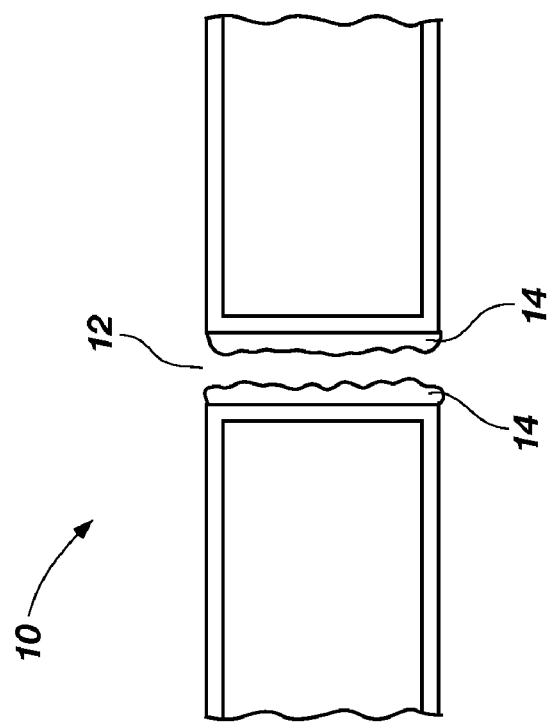
FIG. 1 is a cross-section of a via in a substrate filled using an electroplating process as known in the art.
Figure 4:
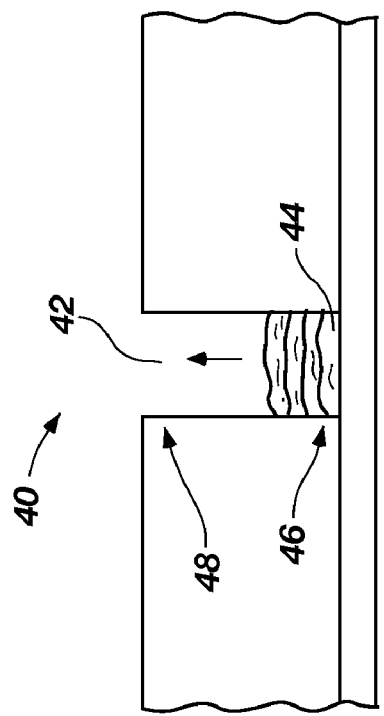
FIG. 4 is a cross-section of a substrate having a via filled using a bottom fill process as known in the art.
Figure 3:
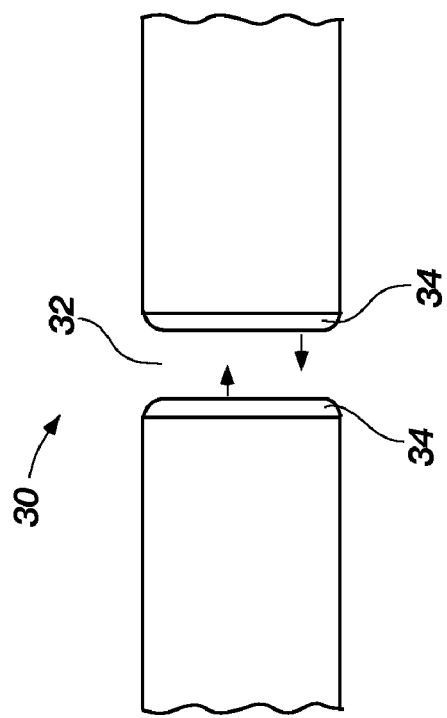
FIG. 3 depicts a cross-section of a substrate having a via filled using an electroless plating process as known in the art.

Generally, the present invention includes methods for manufacturing electrical interconnects, i.e., vias, from one surface of a substrate to the opposite surface of the substrate of a semiconductor component. The vias may electrically connect various electrical structures of the semiconductor component or may be used to electrically connect with other components. It will be apparent to those of ordinary skill in the art that the methods for fabricating vias of the present invention will also be useful in manufacturing interposers and other substrates, such as contactor boards, where electrical interconnects are desired. As used herein, the term "semiconductor component" means and includes electronic components fabricated from semiconductor wafers, other bulk semiconductor substrates, and other substrate materials susceptible to the formation of vias therethrough in accordance with the present invention.

Referring to the accompanying drawings, wherein similar features and elements are identified by the same or similar reference numerals, various embodiments of methods for fabricating vias formed through the thickness of a wafer or other substrate are illustrated. It will be apparent to those of ordinary skill in the art that, while the processes described herein illustrate methods for fabricating vias, the acts described herein comprise a portion of the entire fabrication process of a semiconductor component and may be combined with other fabrication processes. As used herein, the term "substrate" will refer to any supporting structure in which vias may be formed, including, but not limited to, semiconductor wafers, interposer substrates, contactor boards or other substrate-based structures.

The invention includes methods for fabricating a via through the thickness of a wafer or other substrate, wherein the via includes a conductive liner material and a filler material. The filler material may be a conductive or nonconductive material. Referring now to FIG. 5A, there is shown a cross-section of a semiconductor component generally at 100. The semiconductor component 100 includes a substrate 112 having a first surface 114 and an opposing second surface 116. The substrate 112 may comprise an unprocessed semiconductor wafer or other substrate, wherein the substrate may have various process layers formed thereon, including one or more semiconductor layers or other structures. The substrate 112 may further include active portions or other operable portions located thereon, fabricated by etching, deposition or other known techniques. The substrate 112 may further comprise an interposer substrate for use between a test device and a semiconductor device to be tested (contactor board) or between a memory device and system in a package to provide routing among other substrates. In the exemplary embodiment, the substrate 112 comprises a semiconductor material, such as monocrystalline silicon. In other embodiments, the substrate 112 may comprise polycrystalline silicon, germanium, silicon-on-glass, silicon-on-sapphire, a ceramic, a polymer or a glass-filled, epoxy resin material. The substrate 112 may also comprise any other known substrate material.

The semiconductor component 100 has a via 118 extending from the first surface 114 of the substrate 112 to the second surface 116. In the exemplary embodiment, the via 118 has a substantially cylindrical shape and is defined by an inner surface or sidewall 120. In other embodiments, the via 118 may have other shapes, such as an hourglass shape or any other known shape for the formation of vias. The portions of the substrate 112 that circumscribe an uppermost edge 122 and a lowermost edge 124 of the via 118 are illustrated in broken lines. For ease of illustration, the uppermost edge 122 and the lowermost edge 124 of the via 118 will be omitted from subsequent drawings.

In the illustrated embodiment, the via 118 is formed in the substrate 112 by laser ablation and may have a representative diameter of from about 10 µm to 2 mils or greater. Typically, the via 118 will have a diameter of about 50 µm when the semiconductor component 100 is used for stacked chips, interposers, contactor boards or other known electronic components. Since the ratio of the height to width of vias is continually decreasing with the continued miniaturization of integrated circuits, it is contemplated that the via 118 may be formed to have a diameter of about 30 µm. It will be apparent to those of ordinary skill in the art that any known method of forming vias that is appropriate for the type of substrate 112 used to form the semiconductor component 100 may be used to form the via 118 including, without limitation, a dry etch such as a reactive ion etch (RIE), which can remove up to 5 µm of substrate per minute depending on the type of substrate, photochemical etching, or any other known via formation process. It will be further apparent to those of ordinary skill in the art that the diameter of the via 118 and the thickness of the substrate 112 may be any desired dimension depending on the desired use of the semiconductor component 100.

Once the via 118 has been formed in the substrate 112, the inner surface 120 may be cleaned to remove any substrate material affected by the heat produced by the laser ablation process. If desired, a TMAH (tetramethyl ammonium hydroxide) solution may be used to clean the via 118 after formation, which can result in a squared cross-section for the via 118.

The cleaned inner surface 120 may be passivated by coating the inner surface 120 of the substrate 112 with an insulative layer 126 of dielectric or insulative material appropriate for the type of material of the substrate 112. The insulative layer 126 may comprise spin-on-glass, thermal oxide, PARYLENE™ polymer, silicon dioxide, silicon nitride, silicon oxynitride, a glass, i.e., borophosphosilicate glass, phosphosilicate glass or borosilicate glass, or any dielectric having a low dielectric constant known in the art. To accomplish the passivation, the insulative layer 126 may be deposited to any desired thickness using any known process, including, without limitation, physical vapor deposition (PVD), CVD, low-pressure chemical vapor deposition (LPCVD), rapid thermal nitridation (RTN), a spin-on-glass (SOG) process, flow coating or any other known process. In other embodiments, the insulative layer 126 may comprise an insulating polymer, such as BT resin, polyimide, benzocyclobutene or polybenzoxazole deposited using an injection or capillary process or a vacuum draw. The insulative layer 126 may be, for example, of about 1 to 5 µm in thickness. If the substrate 112 comprises an electrically insulating material, such as ceramic, the insulative layer 126 may be omitted.

Figure 5B:
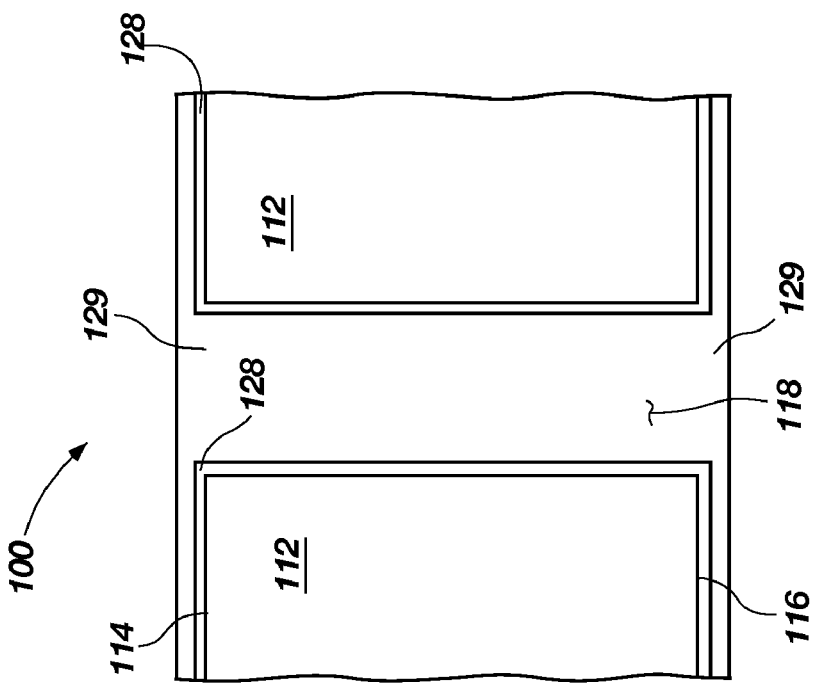
FIGS. 5A through 5G illustrate acts of an exemplary embodiment of a method for filling vias of the present invention.
Figure 5A:
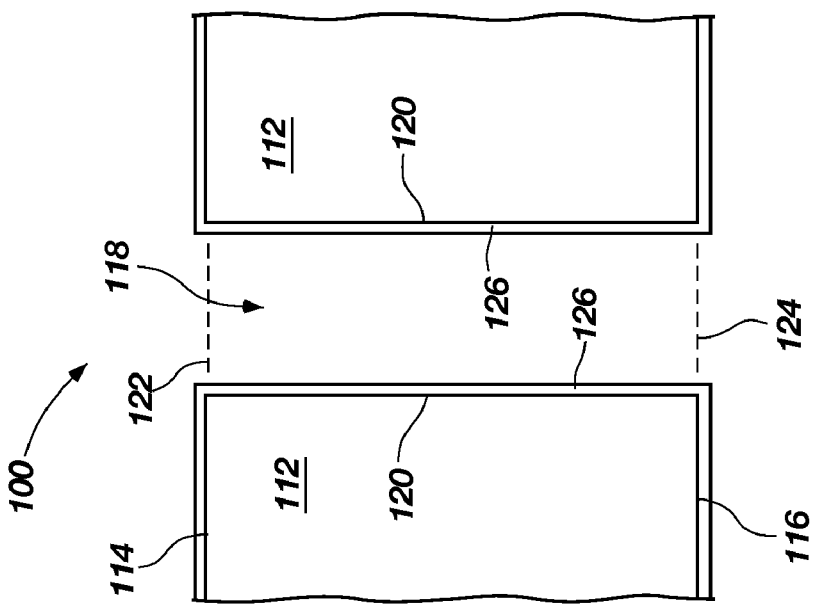

As shown in FIG. 5B, a seed layer 128 of a conductive material is deposited over the first surface 114 and second surface 116 of the substrate 112, and the inner surface 120 of the via 118, wherein the seed layer 128 coats the insulative layer 126 (shown in FIG. 5A). For ease of illustration, the insulative layer 126 of FIG. 5A is omitted from FIG. 5B and other subsequent drawings. In the illustrated embodiment, the seed layer 128 comprises titanium nitride (TiN) and is deposited by CVD. Other materials that may be used as the seed layer 128 include, without limitation, titanium (Ti), silicon nitride ($Si_3N_4$), a polysilicon, tantalum nitride (TaN), and copper. Other deposition processes that may be used to deposit the seed layer 128 include PVD, atomic layer deposition (ALD), PECVD, vacuum evaporation, and sputtering. It will be apparent that the selection of the type of material and deposition process utilized to deposit the seed layer 128 will vary depending on the type of material used to form the electrical interconnect through the via 118.

Figure 5D:
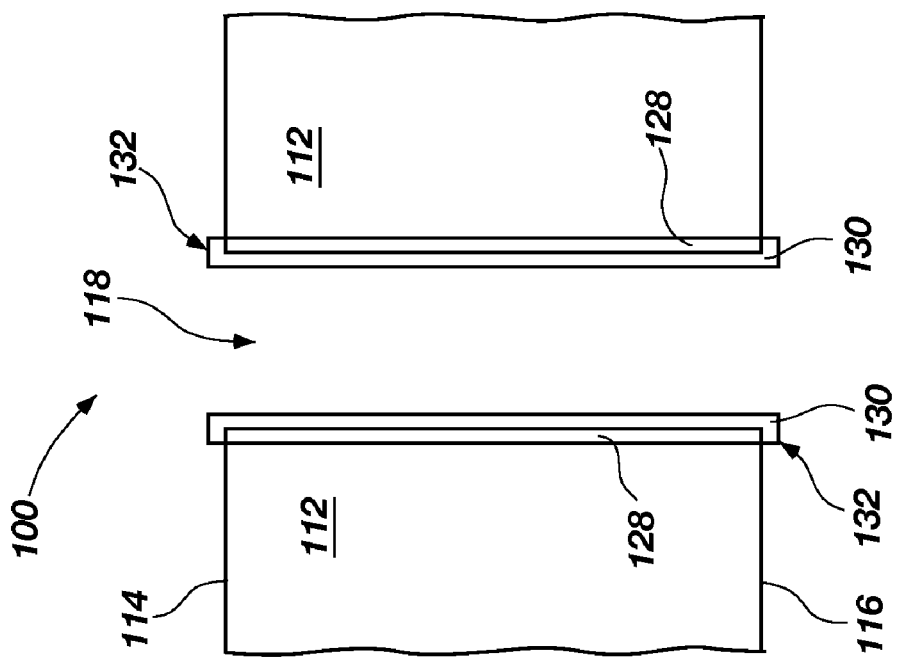
Figure 5C:
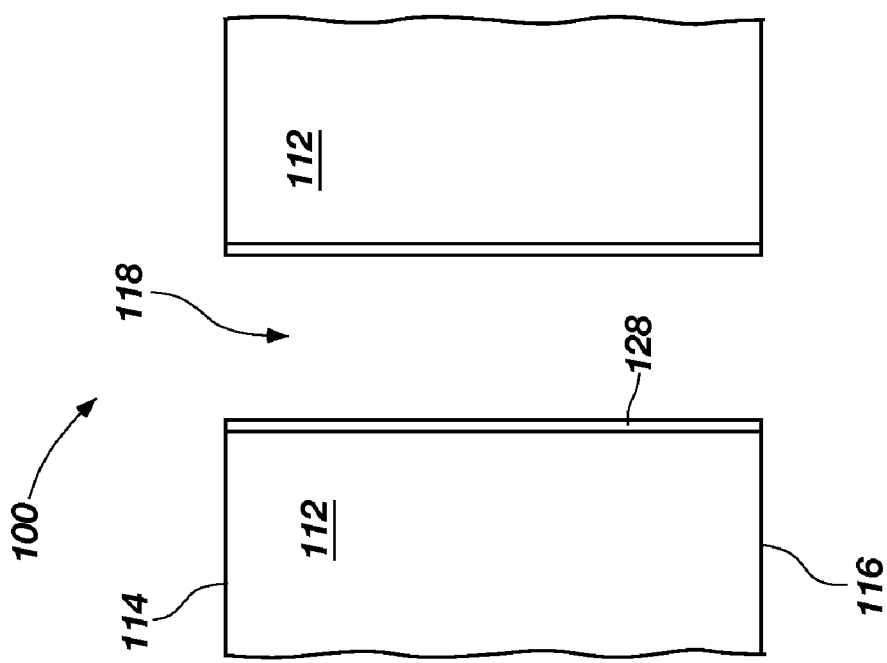

A portion of the seed layer 128 covering the first surface 114 and second surface 116 of the substrate 112 is removed to expose the first surface 114 and second surface 116 of the substrate 112 as illustrated in FIG. 5C. In the illustrated embodiment, the seed layer 128 is removed by an abrasive planarization process such as chemical mechanical planarization (CMP). However, the selective removal of the seed layer 128 may be accomplished using any other known process, such as a wet etch or a dry etch, using an etchant appropriate for the type of material making up the seed layer 128 after masking the portion of seed layer 128 within the via 118.

The seed layer 128 may also be covered with a layer of resist 129. The resist 129 is applied to the seed layer 128 before CMP such that the resist 129 prevents particles produced by the CMP process from being deposited in the via 118. Once the CMP process is finished, the resist 129 is removed using known techniques and produces a pristine seed layer 128 surface for the selective deposition of conductive material.

In another exemplary embodiment, the first surface 114 and the second surface 116 of the substrate 112 may be coated with a nitride layer to prevent the seed layer 128 from being deposited on the first surface 114 and the second surface 116 of the substrate 112 in order to prevent peeling, which may occur depending on the type of conductive material used to coat the surfaces of the substrate 112 and the type of substrate 112 used. The via 118 may be masked to prevent the nitride layer from being deposited in the via 118 or the nitride layer may be applied on the first surface 114 and second surface 116 of the substrate 112 before the via 118 is formed therein. In addition to using a nitride layer, it will be apparent to those of ordinary skill in the art that any other material that prevents the seed layer 128 from being deposited on the first surface 114 and the second surface 116 of the substrate 112 may be used.

The seed layer 128 is coated with a conductive layer 130 of metal as illustrated in FIG. 5D using an electroless deposition process. The conductive layer 130 is deposited on the seed layer 128 and not on the exposed first and second surfaces 114 and 116 of the substrate 112 since the seed layer 128 was removed from (or never present on) these surfaces and the electroless deposition process requires the seed layer 128 for deposition of the conductive layer 130. The selective removal of the seed layer 128 from the first surface 114 and the second surface 116 of the substrate 112 and leaving the seed layer 128 in the via 118 or selective deposition of the conductive layer 130 in the via 118 obviates the need for a subsequent CMP step to remove excess material. The selective deposition of the conductive layer 130 reduces the amount of metal used as the conductive layer 130 and, thus, decreases the cost of manufacturing. Further, the selective deposition of the conductive layer 130 in the via 118 helps prevent adhesion issues that may occur when plating a thick conductive layer 130. Stresses that cause peeling on the conductive layer 130 of the open first surface 114 and the open second surface 116 of the substrate 112 are greater than the peeling stress inside the via 118. The conductive layer 130 may comprise any type of metal including, but not limited to, nickel, cobalt, copper, silver, titanium, iridium, gold, tungsten, tantalum, molybdenum, platinum, palladium, nickel-phosphorus (NiP), palladium-phosphorus (Pd—P), cobalt-phosphorus (Co—P), a Co—W—P alloy, other alloys of the foregoing metals and mixtures thereof. The type and thickness of the metal to be used in the conductive layer 130 will vary depending on the desired conductivity and use of the semiconductor component 100, which may be determined, at least in part, by the resistance (R) of the metal or conductive layer expressed by the equation $R = \rho L/A$ as known in the art.

By coating the seed layer 128 with the conductive layer 130 of a suitable metal, an annular conductive path is created through the via 118. The electroless plating process forms a substantially conformal coating in the via 118 that is substantially free of any voids or keyholes. The conductive layer 130 formed from the electroless plating process will typically have a uniform thickness and a low porosity, will provide corrosion protection and will be relatively hard. The electroless plating process is accomplished by placing the substrate 112 into a bath containing an aqueous solution of the metal to be deposited in ionic form. The aqueous solution also includes a chemical reducing agent such that the metal may be deposited without the use of electrical energy. The driving force for the reduction of the metal ions and subsequent deposition in the electroless plating process is driven by the chemical reducing agent. The reduction reaction is essentially constant at all points on the seed layer 128 so long as the aqueous solution is sufficiently agitated (for example, by ultrasound) to ensure that a uniform concentration of metal ions and reducing agents are distributed in the aqueous solution.

In a further exemplary embodiment, the conductive layer 130 is lined with silver or gold using an immersion process, such as an immersion plating process. If the conductive layer 130 includes nickel or cobalt, the silver or gold lining will replace the nickel or cobalt, since silver and gold are more noble than nickel and cobalt. The silver or gold lining will increase conductivity and aid in wetting the solder to help ensure a void-less fill of solder and continuous contact of solder with the sidewalls of the via 118.

Since the seed layer 128 extends to a plane or level even with the first surface 114 and the second surface 116 of the substrate 112, the deposition of the conductive layer 130 may result in a small portion 132 of the conductive layer 130 extending beyond the plane of the first surface 114 or the second surface 116 of the substrate 112. The small portion 132 may be removed, if desired, using CMP or another known removal process, such that the conductive layer 130 is substantially even with the plane of the first surface 114 and the second surface 116 of the substrate 112 as illustrated in FIG. 5E.

Figure 5F:
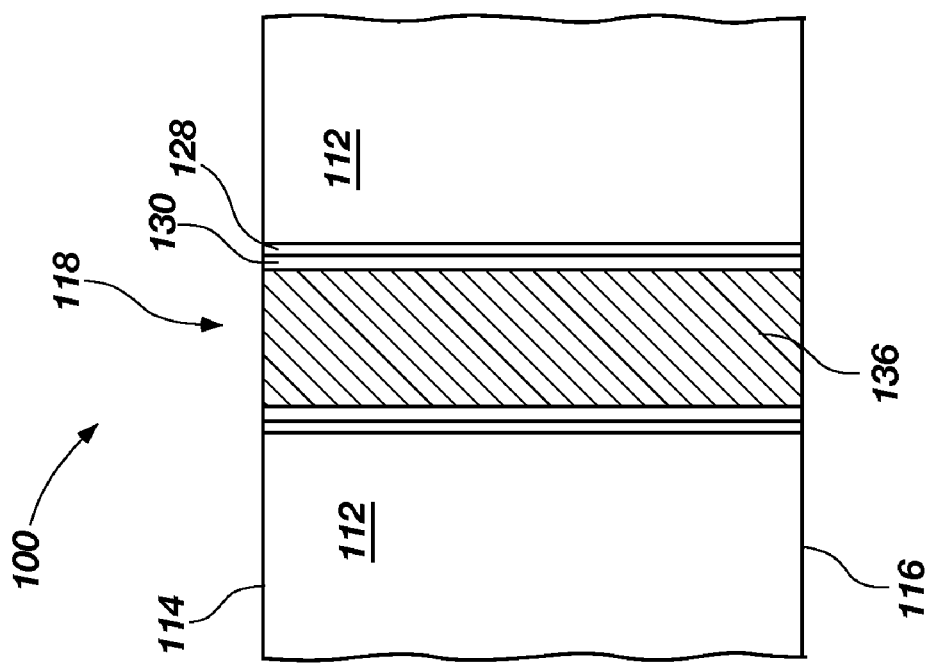
Figure 5E:
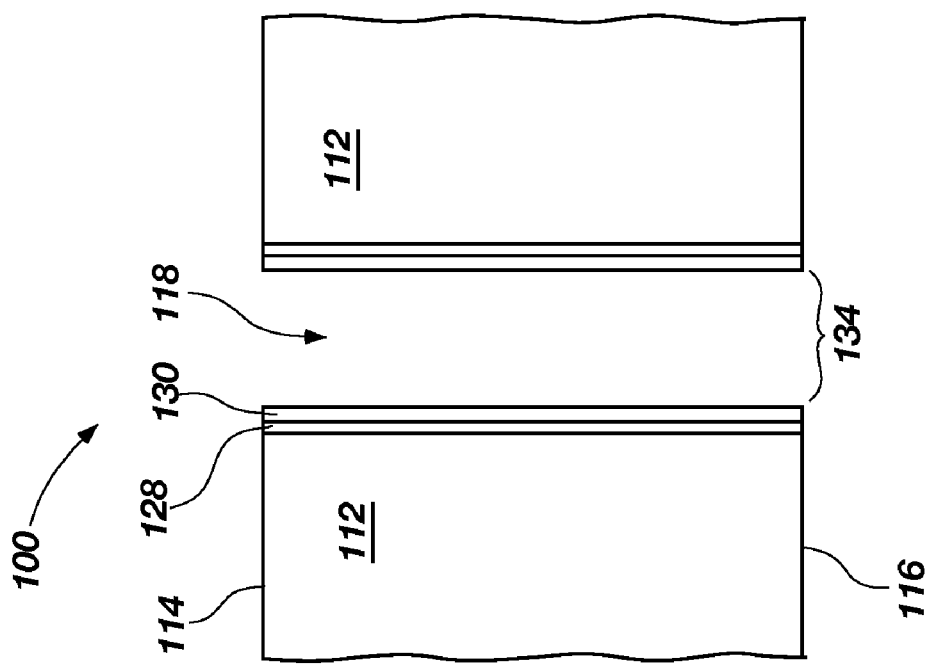

As illustrated in FIG. 5E, the via 118 has an opening 134 extending from the first surface 114 to the second surface 116 wherein the opening 134 is circumscribed by the conductive layer 130. Although the electroless plating process used to form the conductive layer 130 may incidentally result in minor depressions or voids in the conductive layer 130, the thickness of the conductive layer 130 required to accommodate the desired conductivity should be of a dimension such that any voids or depressions should not affect the conductivity. The opening 134 of the via 118 is filled with a filler material 136 as illustrated in FIG. 5F. By forming the conductive layer 130 to the desired thickness and filling the remaining opening 134 of the via 118 with the filler material 136, physical support is provided within the via 118 for the substrate 112 while the conductive path provided by conductive layer 130 is maintained.

The filler material 136 may be a conductive or a nonconductive material depending on the desired conductivity of the filled via 118 and intended use of the semiconductor component 100. For instance, since the conductivity of the filled via 118 is at least minimally determined by the material and thickness of the conductive layer 130, a nonconductive material may be used to fill the opening 134 of the via 118 if conductive layer 130 provides an adequate conductive path. Non-limiting, representative examples of substances that may be used for the filler material 136 include silicon-containing fillers such as spin-on-glass (SOG) applied using a spin coat process for a nonconductive filler material 136 or polysilicon applied using a diffusion process and doped for a conductive filler material 136. Solder paste applied with a squeegee and subsequently reflowed may also be used as a conductive filler material 136. The solder paste may include eutectic solder, Cu—Sn—Ag, Sn—Ag, other known solder materials, or combinations thereof. Other filler materials 136 that may be used include, without limitation, a solder alloy screen printed in the opening 134, conductive and nonconductive polymers, metal-filled silicon, carbon-filled ink, isotropically or anisotropically conductive adhesives and conductor-filled epoxies, such as silver-filled epoxy paste.

Figure 5G:
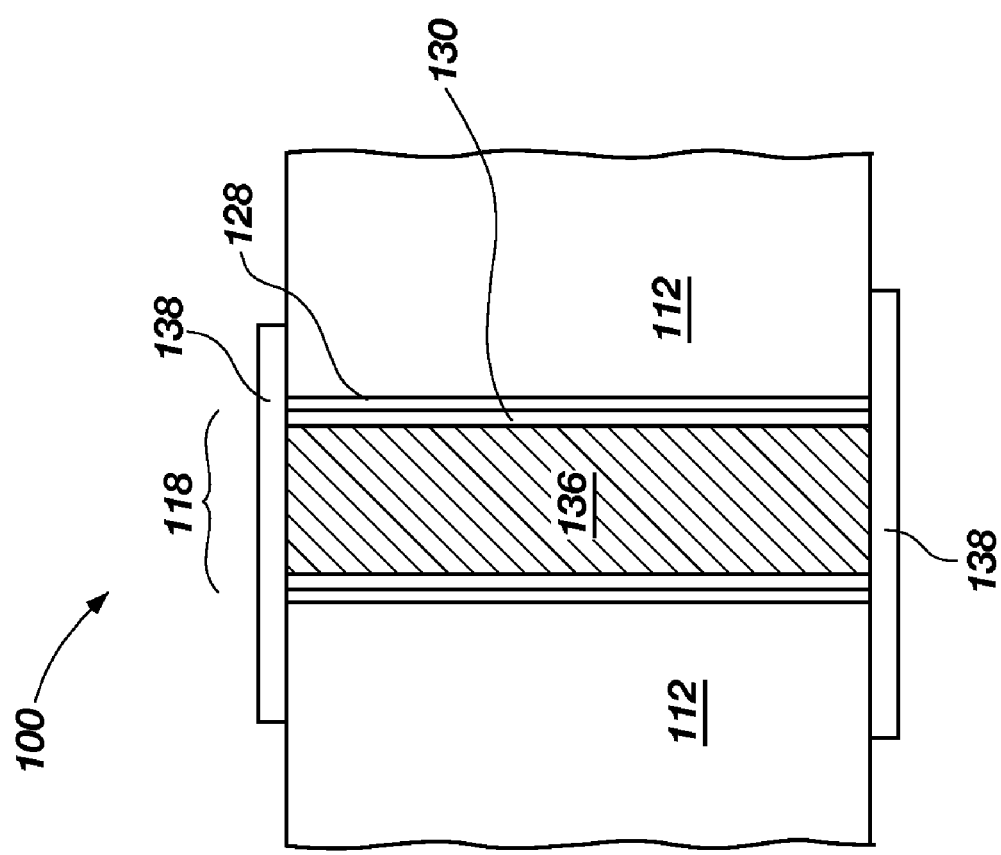

If any of the filler material 136 extends beyond the plane of the first surface 114 or the second surface 116 of the substrate 112 after the opening 134 of the via 118 is filled, any protruding filler material 136 may be removed using CMP or other known smoothing processes such that bond pads 138 may be formed over one or both ends of the via 118 as known in the art and shown in FIG. 5G. The filler material 136 provides physical support to the bond pads 138 overlying the via 118. Although the semiconductor component 100 in the exemplary embodiment is shown with one via 118, it will be apparent to those of ordinary skill in the art that any number of vias 118 may be simultaneously formed, lined and filled in the semiconductor component 100 using the disclosed process.

In another exemplary embodiment, a blind via may be used to form the conductive via of the present invention. A cross-section of a semiconductor component is shown generally at 200 in FIG. 6A. The semiconductor component 200 comprises a substrate 212 having a first surface 214 and an opposing second surface 216. The substrate 212 may comprise an unprocessed semiconductor wafer or other substrate material used in fabrication processes as previously described herein with reference to the substrate 112 of FIG. 5A.

The semiconductor component 200 includes a blind via 218 that partially penetrates the substrate 212 and substantially extends through the substrate 212 from the first surface 214 and wherein a bottom 213 of the blind via 218 terminates short of the second surface 216 of the substrate 212. The blind via 218 may be formed in the substrate 212 using a laser ablation process or in any other manner as the via 118 was formed in the substrate 112 as described herein with reference to FIG. 5A. The blind via 218 is circumscribed by an inner surface or sidewall 220 of the substrate 212. The portion of the substrate 212 that circumscribes an uppermost edge 222 of the blind via 218 is illustrated in broken lines, which, for ease of illustration, is omitted from subsequent drawings.

Figure 6B:
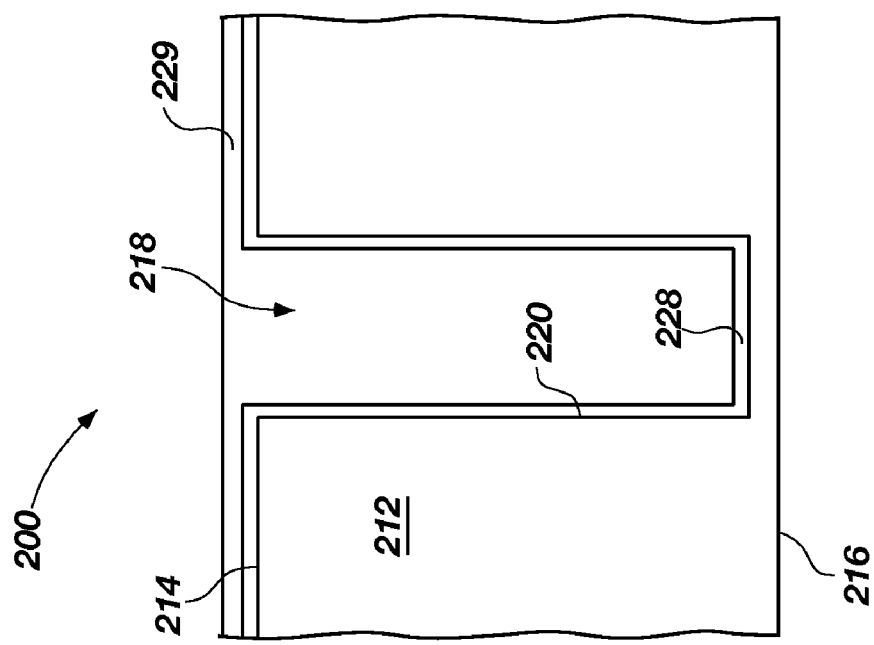
FIGS. 6A through 6H illustrate acts of another exemplary embodiment of a method for filling vias of the present invention.
Figure 6A:
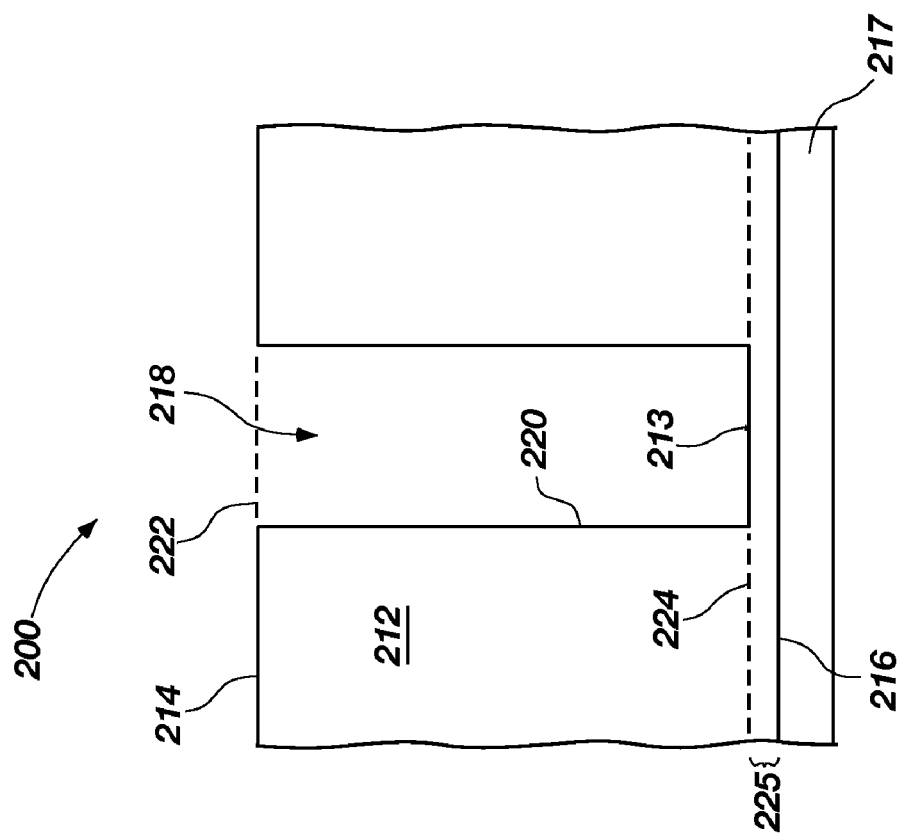

In the exemplary embodiment of FIG. 6A, the blind via 218 may also comprise an opening in the substrate 212 that extends through the substrate 212 (substantially similar to the via 118 of FIG. 5A) that is sealably covered or capped with a cover layer 225 and illustrated with phantom lines 224. The cover layer 225 substantially seals the blind via 218 such that, in essence, the covered via is filled in substantially the same manner as the blind via 218. A seed layer (not shown) may thus also be deposited on the cover layer 225 forming the bottom 213 of blind via 218. In another exemplary embodiment, the cover layer 225 may comprise a metal layer attached to the substrate 212 before the blind via 218 is formed in the substrate 212. Laser ablation may then be used to partially form the blind via 218 that is then completed using a dry etch, which will stop on the metal of cover layer 225. The blind via 218 may be insulated with a passivation layer (not shown) if required.

By forming the blind via 218 using the embodiment of FIG. 6A, contaminants and other process materials may be prevented from getting on or contaminating a wafer chuck 217 or other support structure. The wafer chuck 217 may be used to support the semiconductor component 200 during the fabrication process and the illustration of the wafer chuck 217 will be omitted from subsequent drawings.

The inner surface 220 of the blind via 218 may be cleaned to remove any debris, residual material or substrate material adversely affected by the formation of the blind via 218. The cleaned inner surface 220 may be passivated by coating the inner surface 220 of the substrate 212 with a layer of dielectric or insulative material appropriate for the type of substrate 212. For ease of illustration, the passivation layer is not depicted in FIG. 6A, but it will be apparent to those of ordinary skill in the art that the passivation layer of the blind via 218 may be substantially similar to the insulative layer 126 as described with reference to FIG. 5A. Further, depending on the material of substrate 212, the passivation layer may be omitted.

Referring to FIG. 6B, the semiconductor component 200 is shown with a seed layer 228 of conductive metal formed on the first surface 214 of the substrate 212 and the inner surface 220 of the blind via 218. In the illustrated embodiment, the seed layer 228 is TiN and is deposited by CVD. However, the seed layer 228 may comprise any other material as described herein with reference to the seed layer 128 of FIG. 5B.

Figure 6D:
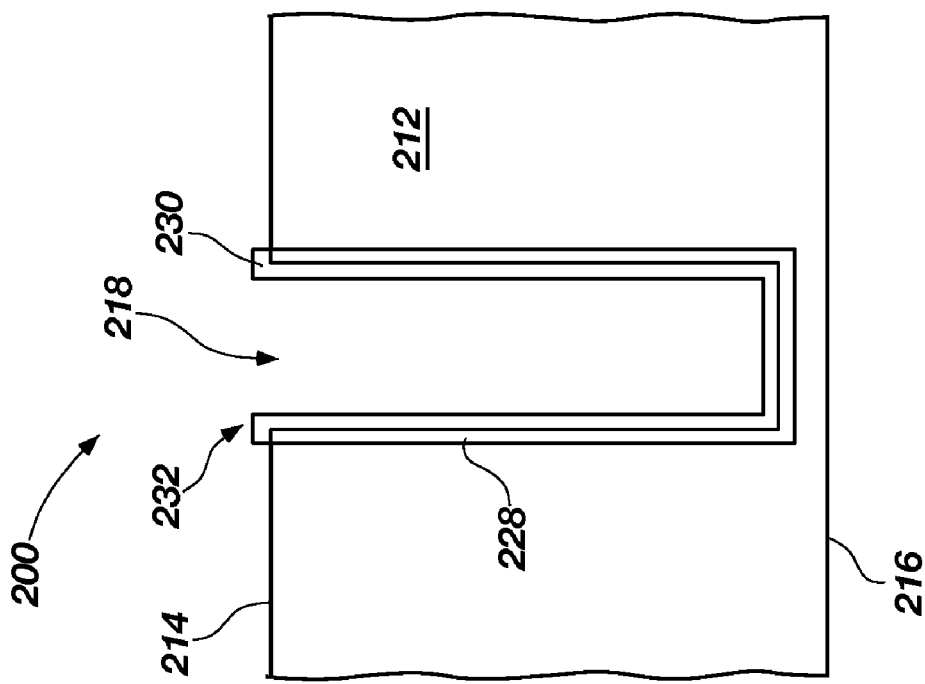
Figure 6C:
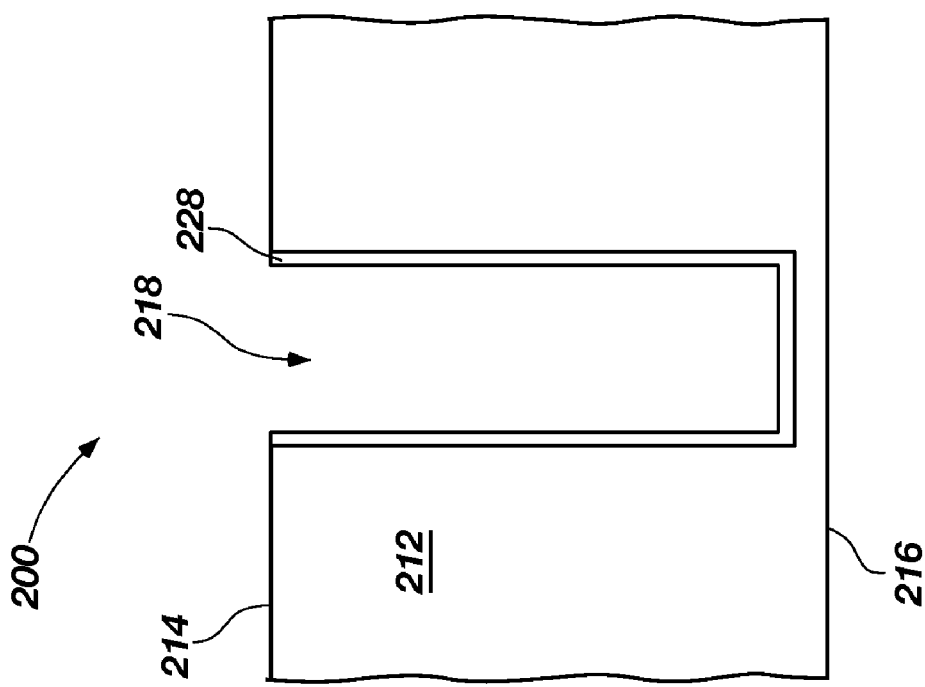

The portion of the seed layer 228 covering the first surface 214 of the substrate 212 is removed by CMP to expose the first surface 214 of the substrate 212 as illustrated in FIG. 6C. It will be apparent that the seed layer 228 may be removed using any known process as previously described herein. A conductive layer 230 is deposited overlying the seed layer 228, as illustrated in FIG. 6D, using an electroless deposition process as previously described herein. The conductive layer 230 will not adhere to the first surface 214 of the substrate 212 since no seed layer 228 is present on the first surface 214 of the substrate 212. The conductive layer 230 may comprise any conductive metal as described herein with reference to the conductive layer 130 of FIG. 5D wherein the type and thickness of the metal utilized in the conductive layer 230 will vary depending on the desired conductivity and ultimate use of the semiconductor component 200.

In another exemplary embodiment, a layer of resist 229 is placed over the seed layer 228 before CMP. The presence of the resist 229 prevents particles produced by the CMP process from contaminating the blind via 218. After CMP, the resist 229 is removed using known techniques and results in a pristine surface for the subsequent deposition of the conductive layer 230.

As the conductive layer 230 is deposited on the seed layer 228, a portion 232 of the conductive layer 230 may extend beyond a plane of the first surface 214 of the substrate 212. If this occurs, the portion 232 of the conductive layer 230 extending beyond the plane of the first surface 214 may be removed as previously described herein with reference to FIG. 5E and result in the semiconductor component 200 of FIG. 6E. In another exemplary embodiment, the portion 232 of the conductive layer 230 extending above the plane of the first surface 214 of the substrate 212 may be left in place and used, at least partially, to form at least a portion of a bond pad (shown in FIG. 6H) subsequently constructed on the first surface 214 of the substrate 212.

The conductive layer 230 may be lined with silver or gold using an immersion plating process in another exemplary embodiment. If the conductive layer 230 includes nickel or cobalt, the nickel or cobalt will be replaced with the silver or gold, since silver and gold are more noble. The inclusion of the silver or gold lining in the conductive layer 230 will also increase conductivity and aid in wetting the solder.

Figure 6F:
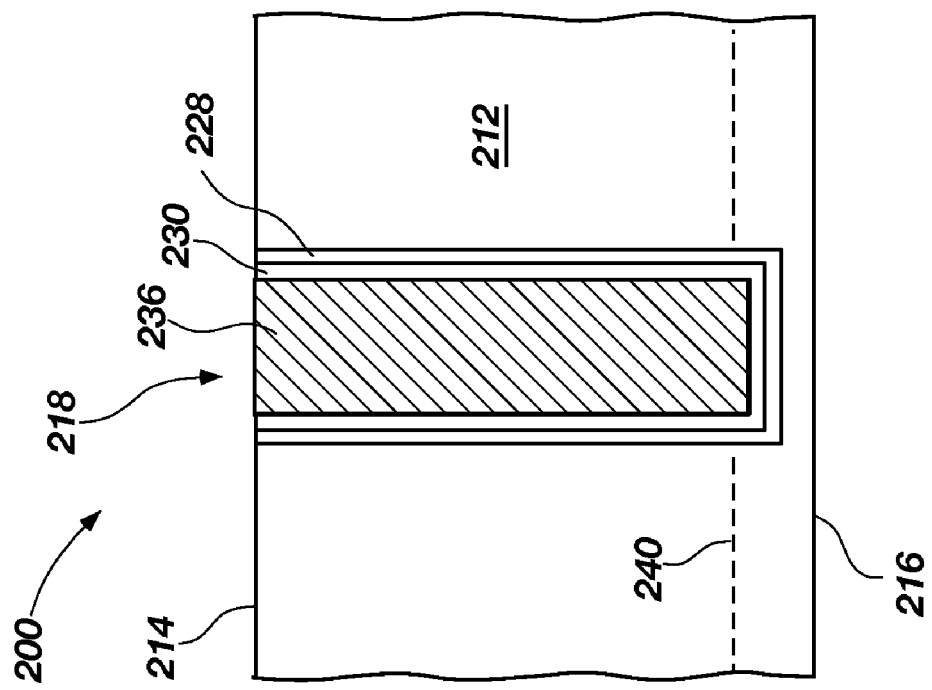
Figure 6E:
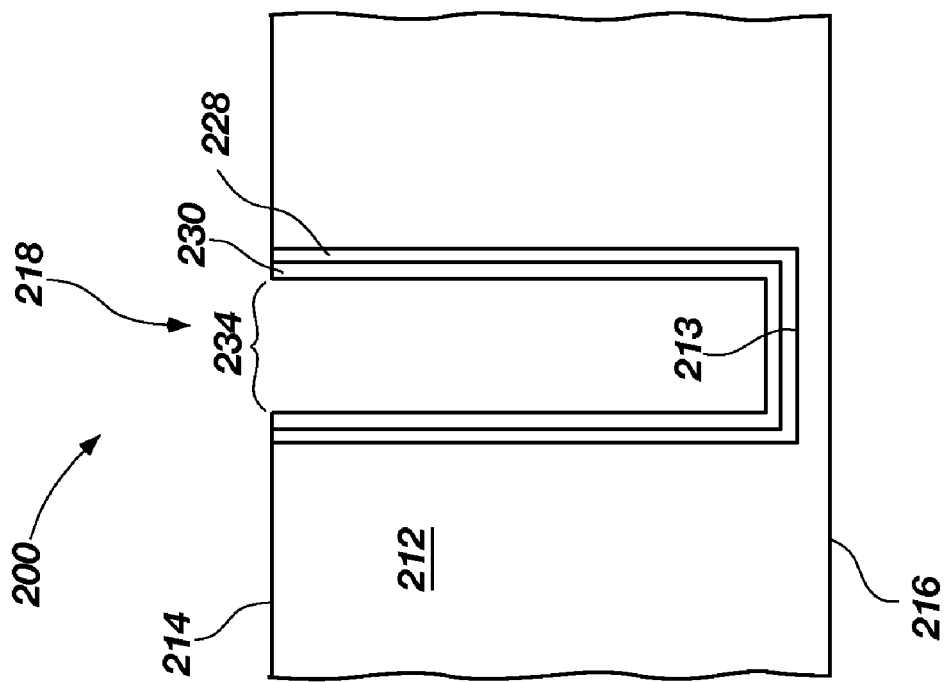

As shown in FIG. 6E, the blind via 218 includes an opening 234 substantially surrounded by the conductive layer 230 that extends from the first surface 214 of the substrate 212 and substantially through the substrate 212 to and over the bottom 213 of the blind via 218. The opening 234 of the blind via 218 is filled with a filler material 236 as illustrated with cross-hatching in FIG. 6F. The filler material 236 may comprise a conductive or a nonconductive material depending on the desired conductivity of the filled blind via 218 as previously described herein with reference to FIG. 5F.

Figure 6H:
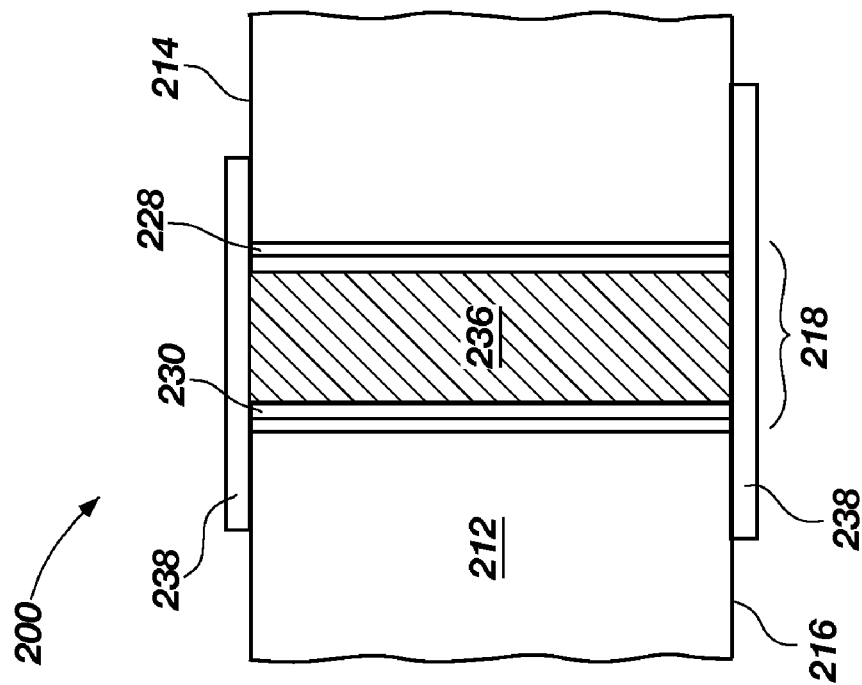
Figure 6G:
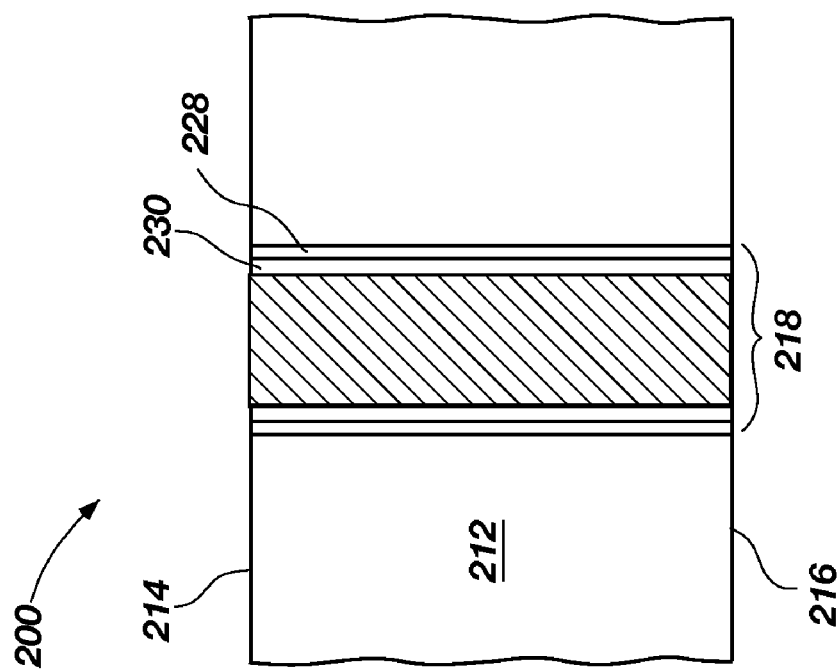

The second surface 216 of the substrate 212 is removed from the semiconductor component 200 using an abrasive planarization process such as CMP or any other known suitable removal process. Material of the substrate 212 is removed to a depth illustrated by broken line 240 in FIG. 6F such that the blind via 218 is exposed on the second surface 216 of the substrate 212 as illustrated in FIG. 6G. Bond pads 238 are formed over opposing ends of the blind via 218 as is known in the art and as illustrated in FIG. 6H. In a variation of this exemplary embodiment, if blind via 218 extended through the substrate 212 to cover layer 225, as described with reference to FIG. 6A, the cover layer 225 may be removed to expose the blind via 218 lined with conductive layer 230 and filled with filler material 236.

Figure 7B:
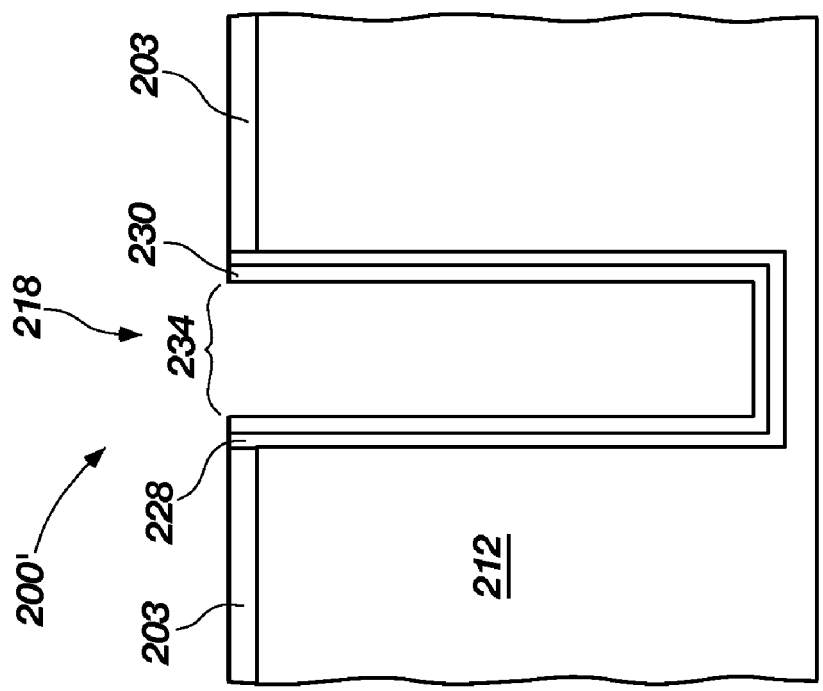
FIGS. 7A and 7B depict acts of another embodiment of a method for forming vias of the present invention.
Figure 7A:
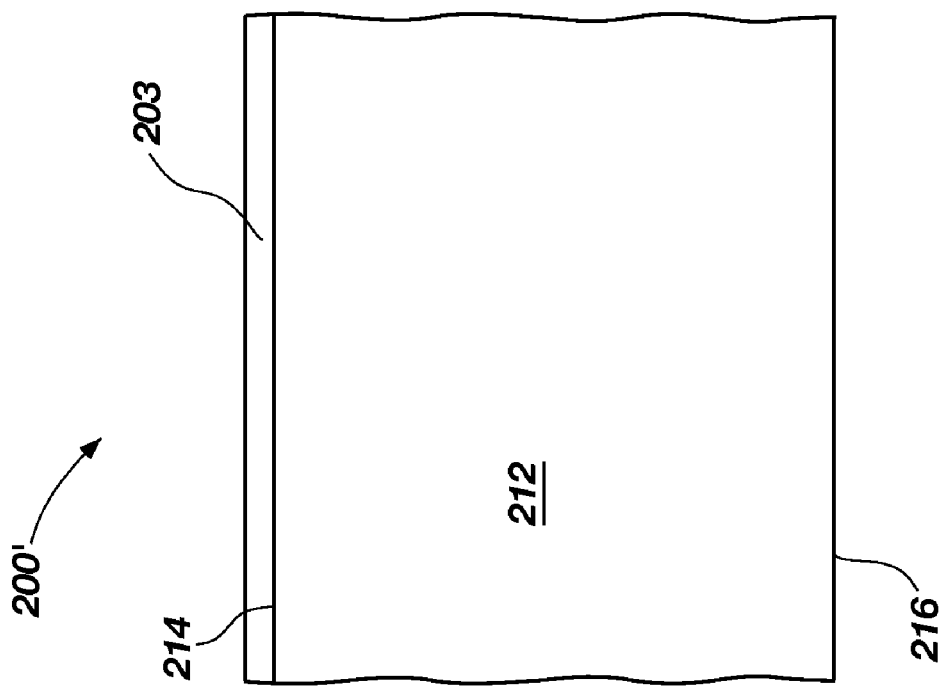

Another exemplary embodiment of acts in the methods of the present invention is depicted in FIGS. 7A and 7B. A semiconductor component is shown generally at 200'. The semiconductor component 200' includes a substrate 212 having a first surface 214 and an opposing, second surface 216. A barrier layer 203 is formed on the first surface 214 of the substrate 212. The barrier layer 203 comprises a material that prevents a seed layer 228 from being deposited thereon. The barrier layer 203 may comprise an oxide- or a nitride-containing material such as silicon dioxide or silicon nitride. A blind via 218 is formed through the barrier layer 203 and in the substrate 212. The seed layer 228 and a conductive layer 230 are formed in the blind via 218, whereafter a remaining opening 234 of the blind via 218 is filled with the filler material as previously discussed herein. The fabrication of the conductive blind via 218 may be completed as previously described.

Figure 8:
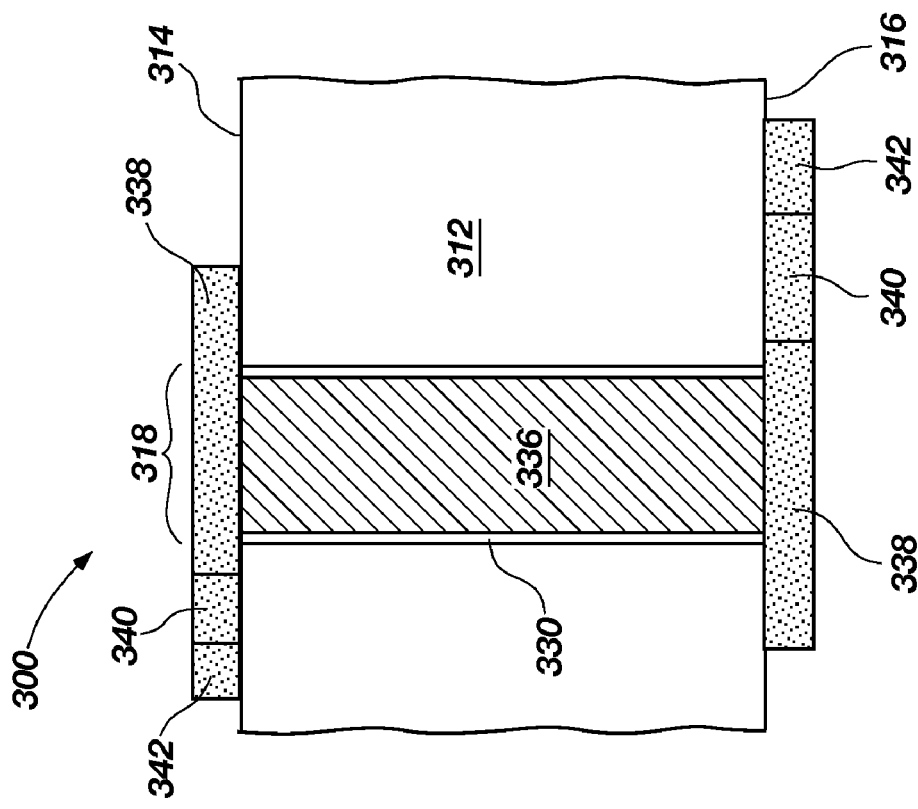
FIG. 8 depicts a semiconductor component having electrical interconnects formed using the present invention.

Referring now to FIG. 8, there is shown a partial cross-section of a semiconductor component 300 that has been fabricated using the methods of the present invention. The semiconductor component 300 includes a substrate 312 with a conductive via 318. The conductive via 318 includes a filler material 336 and an annular conductive liner 330 that forms an electrical connection between bonds pads 338 located on opposing surfaces of the semiconductor component 300.

The semiconductor component 300 may include circuit traces 340 or other interconnects and contact structures to electrically connect the via 318 to contact pads 342 or other conductive structures. The circuit traces 340 or other conductive structures may also be used to connect circuitry of semiconductor component 300 to other circuits such as integrated circuitry formed on an opposing side of substrate 312, to circuits of another semiconductor component disposed over or under semiconductor component 300 in a stack, to an interposer, to a contactor board, or to a carrier substrate such as a motherboard or module board bearing other semiconductor components such as a microprocessor. Further, the blanket material layer from which bond pads 338 are formed may also be patterned to define the circuit traces 340 leading from the via 318 to the contact pads 342. The conductive via 318 thus may be used to electrically connect contact pads 342 on a first surface 314 of the substrate 312 to contact pads 342 on a second surface 316 of the substrate 312.

As noted, the substrate 312 of the semiconductor component 300 may be designed and fabricated as an interposer for connecting various semiconductor components, as a semiconductor test substrate (contactor board) or as a carrier substrate forming higher-level packaging to which semiconductor chips may be connected. If configured as a semiconductor device with active circuitry, the bond pads 338 or contact pads 342 of the semiconductor component 300 may be arranged in a pattern that corresponds to that of terminal pads on a test or carrier substrate. If used as an interposer or contactor board, bond pads 338 or contact pads 342 may be arranged in a pattern on one side of substrate 312 to correspond to terminal pads of a test or carrier substrate and on the other side to correspond to bond pad or other I/O locations on a semiconductor device to be contacted.

Figure 9:
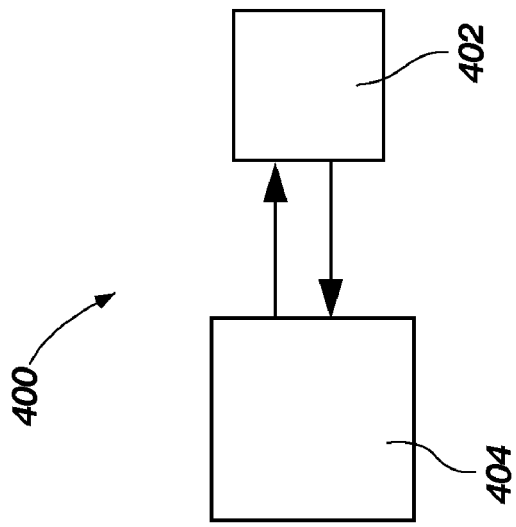
FIG. 9 is a schematic diagram of an electronic system incorporating the electrical interconnects fabricated using the methods of the present invention.

Referring now to FIG. 9, there is shown an embodiment of a system 400 including the conductive vias of the present invention. The system 400 comprises at least one memory device 402, such as a static random access memory (SRAM), dynamic random access memory (DRAM), or other known memory device, wherein the at least one memory device 402 includes at least one conductive via fabricated using the methods of the present invention. The memory device 402 is operatively coupled to a microprocessor 404 that may be programmed to carry out particular functions as is known in the art.

The above-illustrated embodiments of the present invention disclose electrical interconnects in the foam of through-vias that may be fabricated using low-cost materials, requiring simple methods, and resulting in robust electrical interconnects that are substantially free of voids and keyholes. Although the present invention has been depicted and described with respect to various exemplary embodiments, various additions, deletions and modifications are contemplated from the scope or essential characteristics of the present invention. Further, while described in the context of semiconductor devices or interposers, the invention has utility for forming electrical interconnects in any device or component fabricated with semiconductor components. The scope of the invention is, thus, indicated by the appended claims rather than the foregoing description. All changes that come within the meaning and range of equivalency of the claims are to be embraced within their scope.

What is claimed is:

1. A method for forming a conductive interconnect in a substrate, comprising:
   etching at least one blind via in a first surface of a substrate, the at least one blind via extending toward an opposite, second surface of the substrate;
   lining surfaces of the at least one blind via with an oxide material;
   forming a copper seed material over the first surface of the substrate and over the oxide material lining the at least one blind via;
   completely removing the copper seed material overlying the first surface of the substrate while retaining the copper seed material within the at least one blind via;
   forming a conductive material on the retained copper seed material to fill a remaining space within the at least one blind via after completely removing the copper seed material overlying the first surface of the substrate; and
   performing an abrasive planarization process to the second surface of the substrate to expose the conductive material within the at least one blind via.

2. The method of claim 1, wherein forming the copper seed material over the first surface of the substrate and over the oxide material lining the at least one blind via comprises sputtering copper over the first surface of the substrate and over the oxide material lining the at least one blind via.

3. The method of claim 1, wherein forming the conductive material on the retained copper seed material to fill the remaining space within the at least one blind via comprises introducing copper into the remaining space within the at least one blind via.

4. The method of claim 3, wherein introducing copper into the remaining space within the at least one blind via comprises plating copper into the remaining space within the at least one blind via.

5. A method for forming a conductive interconnect in a substrate, comprising:
 forming a nitride material on a first surface of a substrate;
 removing at least a portion of each of the nitride material and the substrate to form at least one blind via extending completely through the nitride material and partially into the substrate;
 passivating surfaces of the at least one blind via with an oxide material;
 forming a seed layer comprising copper over the oxide material, the seed layer substantially confined within the at least one blind via;
 forming a conductive material on the seed layer to fill a remaining space within the at least one blind via; and
 abrasively planarizing an opposite, second surface of the substrate to expose the conductive material of the at least one blind via.

6. The method of claim 5, wherein forming the seed layer comprising copper over the oxide material comprises sputtering copper over the oxide material.

7. The method of claim 5, wherein forming the conductive material on the seed layer comprises plating the conductive material onto the seed layer.

8. The method of claim 7, wherein plating the conductive material onto the seed layer comprises plating a copper material onto the seed layer.

9. The method of claim 5, wherein forming the conductive material on the seed layer comprises forming a copper material on the seed layer.

10. A semiconductor device, comprising:
 a substrate comprising a first surface and an opposite, second surface;
 at least one blind via formed in the first surface of the substrate;
 a passivation material comprising an oxide over surfaces of the at least one blind via;
 a copper seed material over the passivation material; and
 a conductive material comprising copper contacting the copper seed material.

11. The semiconductor device of claim 10, wherein the passivation material comprises a silicon oxide.

12. The semiconductor device of claim 10, wherein the conductive material comprising copper substantially fills a volume circumscribed by the copper seed material.

13. The method of claim 1, wherein forming the conductive material on the retained copper seed material comprises plating the conductive material onto the retained copper seed material.

14. The method of claim 1, wherein completely removing the copper seed material overlying the first surface of the substrate while retaining the copper seed material within the at least one blind via comprises performing an abrasive planarization process to remove the copper seed material overlying the first surface of the substrate while retaining of copper seed material within the at least one blind via.

15. The method of claim 14, further comprising:
 applying a resist material to the copper seed material before performing the abrasive planarization process; and
 removing portions of the resist material remaining after the abrasive planarization process.

16. The method of claim 1, further comprising removing a portion of the conductive material extending beyond a plane of the first surface of the substrate.

17. The method of claim 1, further comprising cleaning the surfaces of the at least one blind via with a tetramethyl ammonium hydroxide solution before lining the surfaces of the at least one blind via with the oxide material.

18. The method of claim 5, further comprising removing a portion of the conductive material extending beyond a plane of the first surface of the substrate.

19. A method for forming a conductive interconnect in a substrate, comprising:
 forming at least one blind via in a first surface of a substrate;
 forming a nitride material on portions of the first surface of the substrate adjacent sidewalls of the at least one blind via;
 passivating surfaces of the at least one blind via with an oxide material;
 forming a seed layer comprising copper over the oxide material, the seed layer substantially confined within the at least one blind via;
 forming a conductive material on the seed layer to fill a remaining space within the at least one blind via; and
 abrasively planarizing an opposite, second surface of the substrate to expose the conductive material of the at least one blind via.

20. The method of claim 19, wherein forming the nitride material on portions of the first surface of the substrate adjacent the sidewalls of the at least one blind via comprises:
 masking an opening of at least one blind via; and
 applying the nitride material to the first surface of the substrate.

21. The method of claim 19, wherein forming the seed layer comprising copper over the oxide material comprises sputtering copper over the oxide material.

22. The method of claim 19, wherein forming the conductive material on the seed layer comprises plating the conductive material onto the seed layer.

23. The method of claim 22, wherein plating the conductive material onto the seed layer comprises plating a copper material onto the seed layer.

24. The method of claim 19, wherein forming the conductive material on the seed layer comprises forming a copper material on the seed layer.

25. The method of claim 19, further comprising removing a portion of the conductive material extending beyond a plane of the first surface of the substrate.

* * * * *

UNITED STATES PATENT AND TRADEMARK OFFICE
CERTIFICATE OF CORRECTION

| | | |
|---|---|---|
| PATENT NO. | : 8,148,263 B2 | Page 1 of 1 |
| APPLICATION NO. | : 12/648864 | |
| DATED | : April 3, 2012 | |
| INVENTOR(S) | : Nishant Sinha | |

It is certified that error appears in the above-identified patent and that said Letters Patent is hereby corrected as shown below:

In column 1, line 6, delete "APPLICATION" and insert -- APPLICATIONS --, therefor.

In column 14, line 1, in Claim 14, delete "of" and insert -- the --, therefor.

Signed and Sealed this
Twenty-ninth Day of May, 2012

David J. Kappos
*Director of the United States Patent and Trademark Office*